US009553126B2

(12) United States Patent
Martin et al.

(10) Patent No.: US 9,553,126 B2
(45) Date of Patent: Jan. 24, 2017

(54) WAFER-LEVEL BONDING METHOD FOR CAMERA FABRICATION

(71) Applicant: OmniVision Technologies, Inc., Santa Clara, CA (US)

(72) Inventors: Alan Martin, San Jose, CA (US); Edward Nabighian, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/269,879

(22) Filed: May 5, 2014

(65) Prior Publication Data
US 2015/0318326 A1 Nov. 5, 2015

(51) Int. Cl.
*H01L 21/00* (2006.01)
*H01L 27/146* (2006.01)

(52) U.S. Cl.
CPC .... *H01L 27/14687* (2013.01); *H01L 27/14685* (2013.01); *H01L 27/14698* (2013.01)

(58) Field of Classification Search
CPC .... H04N 13/0203; H04N 5/369; H04N 9/045; H01L 27/14687; H01L 27/14685; H01L 33/00; H01L 21/78; H01L 31/0232; H01L 31/18; H01L 31/02; H01L 27/14698; B32B 38/10; C23F 1/00; B29D 11/00278
USPC ...... 136/252; 156/249; 216/33; 256/98, 432; 256/E21.599, E31.127, E33.068; 264/1.7; 348/46; 359/619; 382/154; 438/65, 113
See application file for complete search history.

(56) References Cited

U.S. PATENT DOCUMENTS

| 5,366,906 | A  | * | 11/1994 | Wojnarowski | H01L 22/22 257/E21.526 |
|---|---|---|---|---|---|
| 6,624,505 | B2 | * | 9/2003 | Badehi | 257/678 |
| 2002/0031864 | A1 | * | 3/2002 | Ball | H01L 21/6836 438/113 |
| 2002/0166625 | A1 | * | 11/2002 | Ball et al. | 156/247 |
| 2005/0158009 | A1 | * | 7/2005 | Eichelberger | H01L 21/56 385/147 |
| 2006/0035415 | A1 | * | 2/2006 | Wood et al. | 438/125 |
| 2006/0264006 | A1 |   | 11/2006 | Kian et al. | |
| 2007/0029277 | A1 | * | 2/2007 | Jacobowitz | B29D 11/00365 216/24 |
| 2007/0275505 | A1 | * | 11/2007 | Wolterink | G02B 13/006 438/118 |
| 2008/0142846 | A1 | * | 6/2008 | Kim | H01L 21/0237 257/200 |
| 2009/0126872 | A1 | * | 5/2009 | Sampica et al. | 156/382 |
| 2011/0261550 | A1 |   | 10/2011 | Wong et al. | |

(Continued)

OTHER PUBLICATIONS

U.S. Appl. No. 14/270,281 Office Action dated Aug. 31, 2015, 12 pages.

(Continued)

*Primary Examiner* — Xinning Niu
*Assistant Examiner* — Vu A Vu
(74) *Attorney, Agent, or Firm* — Lathrop & Gage LLP

(57) ABSTRACT

A wafer-level method for fabricating a plurality of cameras includes modifying an image sensor wafer to reduce risk of the image sensor wafer warping, and bonding the image sensor wafer to a lens wafer to form a composite wafer that includes the plurality of cameras. A wafer-level method for fabricating a plurality of cameras includes bonding an image sensor wafer to a lens wafer, using a pressure sensitive adhesive, to form a composite wafer that includes the plurality of cameras.

19 Claims, 10 Drawing Sheets

(56) References Cited

U.S. PATENT DOCUMENTS

| | | | |
|---|---|---|---|
| 2011/0316108 A1* | 12/2011 | Nihei | H01L 27/14618 257/435 |
| 2012/0091551 A1* | 4/2012 | Marenco | H01L 27/14625 257/432 |
| 2012/0155854 A1 | 6/2012 | Huang et al. | |
| 2012/0242814 A1* | 9/2012 | Kubala | B26F 1/38 348/76 |
| 2012/0243077 A1* | 9/2012 | Osawa | G02B 3/0056 359/356 |
| 2012/0325402 A1* | 12/2012 | Suwa | B32B 37/1207 156/275.5 |
| 2013/0224425 A1* | 8/2013 | Yamazaki | C09J 7/00 428/78 |
| 2014/0225131 A1 | 8/2014 | Benson et al. | |

OTHER PUBLICATIONS

U.S. Appl. No. 14/270,281 Notice of Allowance dated Nov. 10, 2015, 10 pages.

\* cited by examiner

300

```
┌─────────────────────────────────────────────────────────────────────────────┐
│ FORM AT LEAST ONE STRESS-RELIEVING TRENCH IN PORTION OF IMAGE SENSOR WAFER  │
│                     NOT COINCIDING WITH AN IMAGE SENSOR                     │
│                                     310                                     │
│  ┌───────────────────────────────┐   ┌───────────────────────────────────┐  │
│  │       FORM AT LEAST ONE       │   │       FORM AT LEAST ONE STRESS-   │  │
│  │   STRESS-RELIEVING TRENCH     │   │   RELIEVING TRENCH THAT SPANS     │  │
│  │   THAT SPANS PLANAR EXTENT    │   │   PLANAR EXTENT OF IMAGE SENSOR   │  │
│  │   OF IMAGE SENSOR WAFER IN    │   │   WAFER IN A SECOND DIRECTION     │  │
│  │      A FIRST DIRECTION        │   │   DIFFERENT FROM THE FIRST        │  │
│  │             320               │   │            DIRECTION              │  │
│  │                               │   │               330                 │  │
│  └───────────────────────────────┘   └───────────────────────────────────┘  │
└─────────────────────────────────────────────────────────────────────────────┘
```

```
┌─────────────────────────────────────────────────────────────────────────┐
│ OPTICALLY ALIGN IMAGE SENSOR WAFER WITH LENS WAFER, USING OPTICAL ACCESS TO │
│           IMAGE SENSOR WAFER THROUGH LENS WAFER                         │
│                              810                                        │
│  ┌─────────────────────────────┐  ┌─────────────────────────────┐      │
│  │ ALIGN AT LEAST TWO REFERENCE│  │ UTILIZE OPTICAL ACCESS THROUGH│    │
│  │  MARKS ON LENS WAFER WITH AT│  │    OPTICALLY CLEAR ADHESIVE  │    │
│  │ LEAST TWO RESPECTIVE IMAGE  │  │ DISPOSED BETWEEN IMAGE SENSOR│    │
│  │          SENSORS            │  │       WAFER AND LENS WAFER   │    │
│  │            820              │  │             830              │    │
│  └─────────────────────────────┘  └─────────────────────────────┘      │
└─────────────────────────────────────────────────────────────────────────┘
```

FIG. 8

WAFER-LEVEL BONDING METHOD FOR CAMERA FABRICATION

BACKGROUND

The development of imaging systems manufactured with complementary metal-oxide-semiconductor (CMOS) technologies used to fabricate integrated circuits has made cameras ubiquitous in high-volume consumer products, such as cellular phones and automotive camera systems. In the CMOS manufacturing process, integrated circuits, such as image sensors, are fabricated on a substrate called a wafer. A large number of image sensors may be fabricated on a single wafer. Similarly, a large number of identical lenses may be fabricated on a single substrate, using a single molding tool to shape all lenses, to form a lens wafer. For production of cameras with imaging objectives composed of multiple lenses, one or more lens wafers are stacked to make a lens wafer composed of multiple identical lens stacks, each forming an imaging objective. The image sensor wafer is diced to make individual image sensors, and the lens wafer is diced to make individual lenses or lens stacks. Cameras are then fabricated by disposing an image sensor on each lens or lens stack.

SUMMARY

In an embodiment, a wafer-level method for fabricating a plurality of cameras includes modifying an image sensor wafer to reduce risk of the image sensor wafer warping, and bonding the image sensor wafer to a lens wafer to form a composite wafer that includes the plurality of cameras.

In an embodiment, a wafer-level method for fabricating a plurality of cameras includes bonding an image sensor wafer to a lens wafer, using a pressure sensitive adhesive, to form a composite wafer that includes the plurality of cameras.

BRIEF DESCRIPTION OF THE DRAWINGS

FIG. 3 illustrates a method for modifying an image sensor wafer to reduce the risk of warping of the image sensor wafer, according to an embodiment.

FIG. 8 illustrates a method for optically aligning an image sensor wafer with a lens wafer, according to an embodiment.

DETAILED DESCRIPTION OF THE EMBODIMENTS

Figure 1:
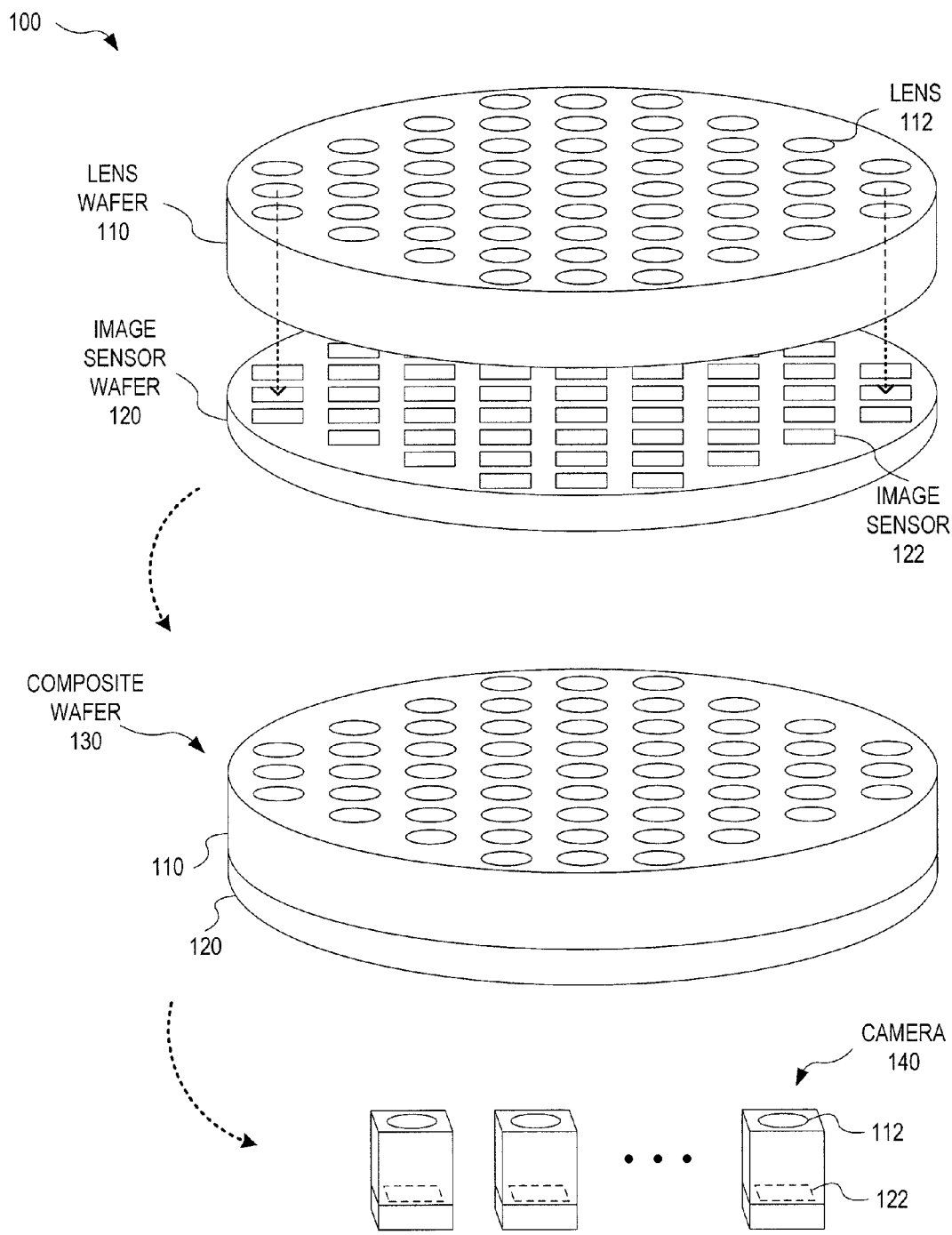
FIG. 1 illustrates a wafer-level bonding method for fabricating a plurality of cameras utilizing lens-to-image sensor bonding at the wafer-level, according to an embodiment.

FIG. 1 illustrates one exemplary wafer-level bonding method 100 for fabricating a plurality of cameras utilizing lens-to-image sensor bonding at the wafer-level. Wafer-level bonding method 100 thus produces a plurality of cameras using only a single alignment operation. A lens wafer 110, which includes a plurality of lenses 112, is bonded to an image sensor wafer 120, which includes a plurality of image sensors 122, to form a composite wafer 130. Lens wafer 110 and image sensor wafer 120 are configured and aligned with respect to each other, such that each of at least a portion of image sensors 112 are aligned with a respective lens 122 to form a camera 140. Accordingly, composite wafer 130 includes a plurality of cameras 140, which may be singulated from composite wafer 130 by dicing composite wafer 130. In an embodiment, each lens 112 of lens wafer 110 is a single lens. In another embodiment, each lens 112 of lens wafer 110 is a stack of several lenses. For example, lens wafer 110 may be formed by bonding together two or more individual lens wafers, each including lenses associated with a respective layer in the lens stack. For the purpose of the present disclosure, the term "lens" may refer to a single lens, a stack of lenses, a pin-hole aperture, a stack of pin-hole apertures, a Fresnel filter, or an imaging objective, optionally including elements that do not serve to affect focusing of incident light, such as wavelength filters, apertures, and substrates. Similarly, the term "lens wafer" may refer to a wafer including a plurality of lenses according to the above definition. Lens wafer 110 may include more of fewer lenses 112 than illustrated in FIG. 1, and lenses 112 may be arranged in a pattern different from that illustrated in FIG. 1, without departing from the scope hereof. Similarly, image sensor wafer 120 may include more or fewer image sensors 122 than illustrated in FIG. 1, and image sensors 122 may be arranged in a pattern different from that illustrated in FIG. 1, without departing from the scope hereof. For clarity of illustration, not all lenses 112, image sensors 122, and cameras 140 are labeled in FIG. 1.

Wafer-level bonding method 100 requires only a single alignment operation, namely that of image sensor wafer 120 with respect to lens wafer 110. In contrast, fabrication of wafer-level cameras according to conventional methods, wherein lenses and image sensors are singulated before bonding, requires an independent alignment operation for each individual camera. Typically sized image sensor wafers and lens wafers may accommodate thousands of image sensors and lenses, respectively. Therefore, conventional methods typically require thousands of alignment operations to assemble the cameras associated with a typically sized pair of lens and image sensor wafers. The performance of wafer-level cameras relies on precise alignment between the lens stack and the image sensor, which is a demanding task when each camera must be aligned individually. In wafer-level bonding method 100, all of the thousands of individual cameras are aligned in a single operation. Consequently, method 100 offers substantial benefit in terms of camera fabrication complexity and cost. Additionally, method 100 may offer improved performance characteristics of the cameras 140, since a batch of cameras 140 produced from lens wafer 110 and image sensor wafer 120 generally will exhibit low camera-to-camera alignment variation.

Embodiments of wafer-level bonding method 100, discussed below, include certain steps associated with overcoming challenges of bonding image sensor wafer 120 to lens wafer 110. These challenges include (a) preventing warping of image sensor wafer 120, which may adversely affect the alignment of image sensor wafer 120 with respect to lens wafer 110, (b) gaining optical access through an adhesive layer used to bond image sensor wafer 120 to lens wafer 110, and (c) preventing breakage of image sensor wafer 120 during bonding to lens wafer 110.

Figure 2:
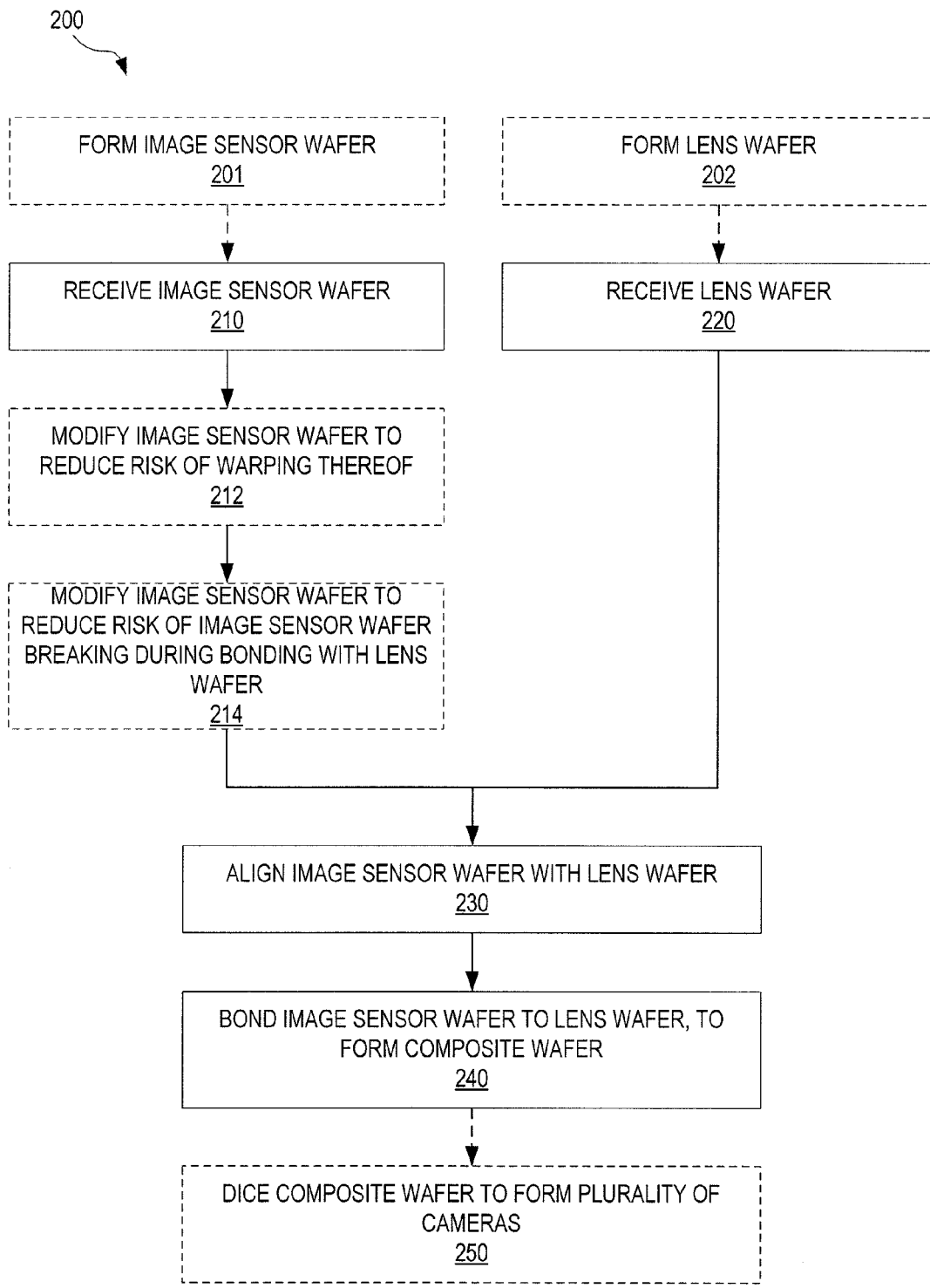
FIG. 2 illustrates a wafer-level bonding method for camera fabrication, according to an embodiment.

FIG. 2 illustrates one exemplary wafer-level bonding method 200 for camera fabrication. Wafer-level bonding method 200 is an embodiment of wafer-level bonding method 100 (FIG. 1). In a step 210, method 200 receives an image sensor wafer, such as image sensor wafer 120 of FIG. 1. In a step 220, method 200 receives a lens wafer, such as lens wafer 110 of FIG. 1. In a step 230, the image sensor wafer and lens wafer received in steps 210 and 220, respectively are aligned with respect to each other. For example, image sensor wafer 120 (FIG. 1) is aligned to lens wafer 110 (FIG. 1) such that each of at least a portion of individual lenses 112 of lens wafer 110 are aligned with respective image sensors 122 of image sensor wafer 120. The alignment may be performed using optical or mechanical referencing, or a combination thereof. In a step 240 the image sensor wafer is bonded to the lens wafer to form a composite wafer. Since, in step 240, each of at least a portion of the lenses of the lens wafer are aligned with respective image sensors of the image sensor wafer, the composite wafer includes cameras, where each camera includes a lens and an image sensor of the lens and image sensor wafer, respectively. For example, image sensor wafer 120 (FIG. 1) is bonded to lens wafer 110 (FIG. 1), such that the resulting composite wafer 130 (FIG. 1) includes a plurality of cameras 140 (FIG. 1). In an embodiment, bonding is achieved using an optically clear adhesive, such as an epoxy, an ultraviolet (UV) curable epoxy, a thermally curable epoxy, a dry film, or a pressure sensitive adhesive, such that the alignment of step 230 may be performed optically with the adhesive located between the image sensor wafer and the lens wafer. In another embodiment, step 230 utilizes other bonding methods known in the art, such as direct bonding, annealing, or plasma activated bonding.

In an embodiment, method 200 further includes one or both of steps 212 and 214 performed after step 210 and before step 230. In step 212, the image sensor wafer received in step 210 is modified to risk of the image sensor wafer warping. Warping may adversely affect the alignment performed in step 230. Hence, step 212 serves to improve the alignment properties achieved in step 230. Step 212 may include reducing risk of warping by at least partially releasing stress in the image sensor wafer, for example by applying stress-relieving cuts to the image sensor wafer. In an example, stress in image sensor wafer 120 (FIG. 1) is at least partially released prior to aligning image sensor wafer 120 with lens wafer 110 (FIG. 1). In step 214, the image sensor wafer received in step 210, and optionally modified in step 212, is modified to reduce risk of the image sensor wafer breaking during bonding to the lens wafer in step 240. For example, image sensor wafer 120 (FIG. 1) is modified to reduce risk of breaking during bonding to lens wafer 110 (FIG. 1). Step 214 may be advantageously included in embodiments of method 200, wherein step 240 includes applying mechanical pressure to the image sensor wafer. An image sensor wafer is generally more fragile than a single image sensor. In embodiments of method 200 that include step 212, the modifications made in step 212 may increase the fragility of the image sensor wafer. Step 214 serves to prepare the image sensor wafer for bonding, such that the image sensor wafer does not break during step 240. In one example, the image sensor wafer is modified to avoid or reduce the significance of local pressure points associated with non-flatness of the surface of the image sensor wafer that faces away from the lens wafer in step 240. Non-flatness may be due to, for example, solder bumps on the image sensor wafer. In another example, the image sensor wafer is strengthened by mounting thereto a strengthening support structure. Step 214 may be performed after step 230 and before step 240, without departing from the scope hereof.

In an embodiment, method 200 further includes a step 250, performed subsequently to step 240. In step 250, the composite wafer formed in step 240 is diced to form the plurality of cameras. For example, composite wafer 130 (FIG. 1) is diced to form a plurality of cameras 140 (FIG. 1). Step 250 may include masking the composite wafer prior to dicing, and removing the mask after dicing.

In an embodiment, method 200 includes one or both of steps 201 and 202 for forming the image sensor wafer and the lens wafer, respectively. Steps 201 and 202 may be performed using methods known in the art.

FIG. 3 illustrates one exemplary method 300 for modifying an image sensor wafer to reduce the risk of warping of the image sensor wafer. Method 300 is an embodiment of step 212 of method 200 (FIG. 2). In a step 310, at least one stress-relieving trench is formed in a portion of the image sensor wafer that does not coincide with an image sensor. For example, at least one stress-relieving trench is formed in a portion of image sensor wafer 120 (FIG. 1) that does not coincide with an image sensor 122 (FIG. 1). In one embodiment, each of the at least one stress-relieving trench is formed by making a cut into the image sensor wafer, which does not fully penetrate the image sensor wafer. In another embodiment, at least a portion of the at least one stress-relieving trench is formed by making a cut into the image sensor wafer, where the cut penetrates the image sensor wafer for a fraction of the length of the stress-relieving trench.

In an embodiment, step 310 includes a step 320, wherein at least one stress-relieving trench is formed, which spans the planar extent of the image sensor wafer in a first direction. For example, at least one stress-relieving trench is formed in image sensor wafer 120 (FIG. 1), such that the stress-relieving trench spans the full extent of image sensor wafer 120 along a direction in the plane of image sensor wafer 120. In an embodiment, step 310 further includes a step 330, wherein at least one stress-relieving trench is formed, which spans the planar extent of the image sensor wafer in a second direction that is different from the first direction. For example, at least one stress-relieving trench is formed in image sensor wafer 120 (FIG. 1), such that the stress-relieving trench spans the full extent of image sensor wafer 120 along a direction, different from the direction used in step 320, in the plane of image sensor wafer 120. The combination of step 310 and 320 may provide release of stress to prevent or reduce warping along any direction within the plane of the image sensor wafer.

Figure 4A:
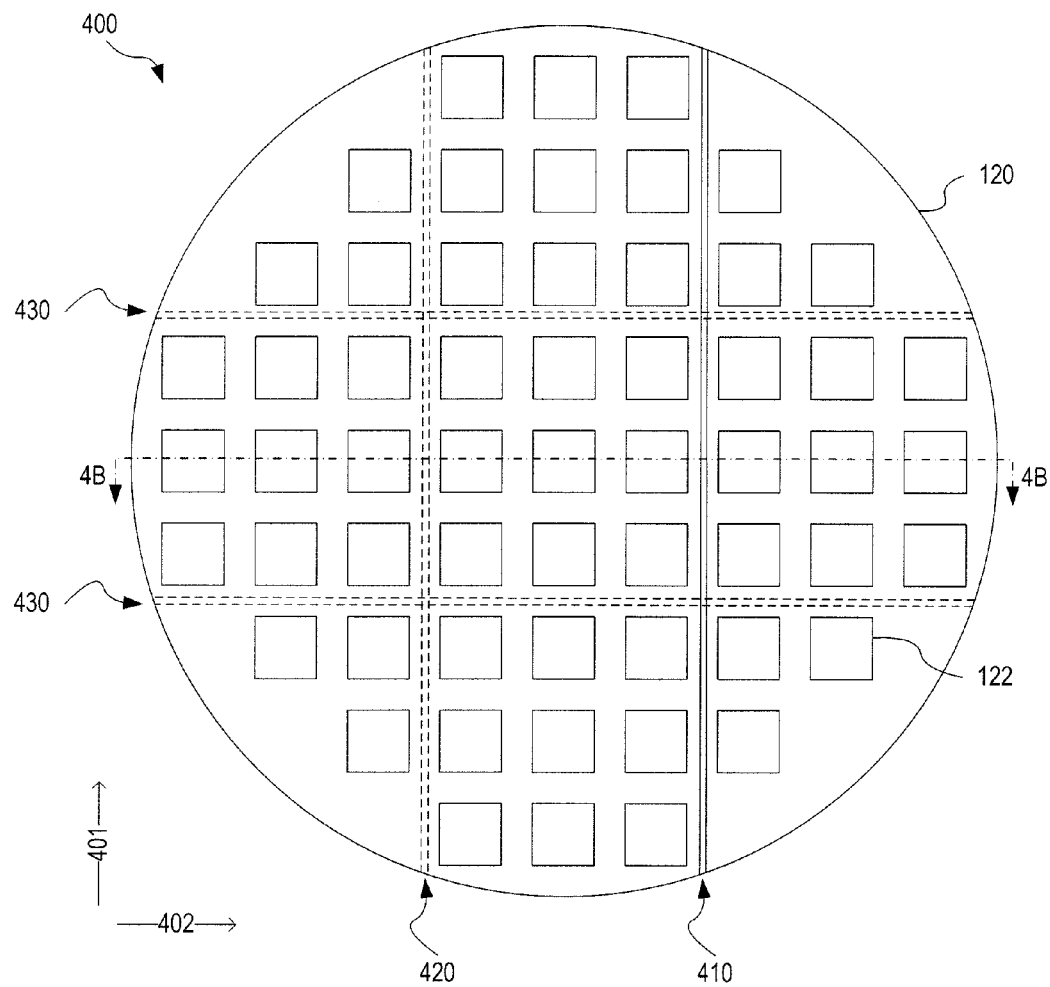
FIGS. 4A and 4B illustrate, in top-plan view and cross-sectional side view, respectively, an image sensor wafer that has one or more stress-relieving trenches, according to an embodiment.
Figure 4B:
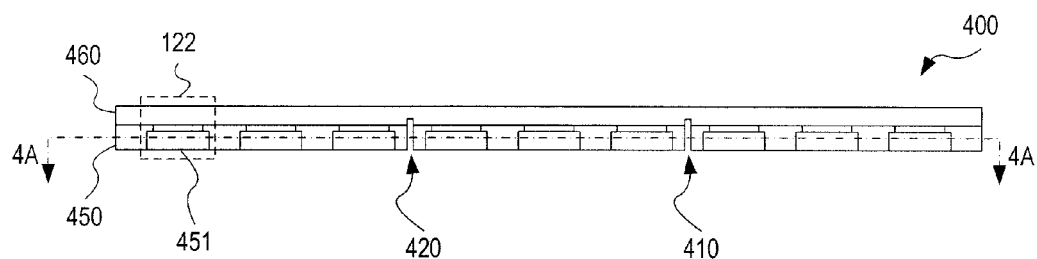

FIGS. 4A and 4B illustrate one exemplary image sensor wafer 400 that has one or more stress-relieving trenches. Image sensor wafer 400 may be the outcome of modifying an image sensor wafer, such as image sensor wafer 120 (FIG. 1), according to method 300 (FIG. 3). FIGS. 4A and 4B show image sensor wafer 400 in top-plan view and cross-sectional side-view, respectively. FIGS. 4A and 4B are best viewed together. Image sensor wafer 400 includes a sensor layer 450 and a cover-glass layer 460 disposed on sensor layer 450. Image sensor wafer 400 includes a plurality of image sensors 122, each including a bare image sensor 451 and a portion of cover-glass layer 460. Image sensors 122 are capable of forming images from light received through cover-glass layer 460. For clarity of illustration, not all image sensors 122 and bare image sensors 451 are labeled in FIGS. 4A and 4B.

Image sensor wafer 400 includes a stress-relieving trench 410. Stress-relieving trench 410 is located in between two columns of images sensors 122. Stress-relieving trench 410 fully penetrates sensor layer 450 while penetrating only a fraction, greater than zero and less than one, of cover glass layer 460. Stress-relieving trench 410 spans the planar extent of image sensor wafer 400 along a direction 401. Optionally, image sensor wafer 400 includes an additional stress-relieving trench 420, which also spans the planar extent of image sensor wafer 400 along direction 401. In an embodiment, image sensor wafer 400 includes one or more stress-relieving trenches 430 that span the planar extent of image sensor wafer 400 in a direction 402. Direction 402 is substantially orthogonal to direction 401.

Although illustrated in FIG. 4A as spanning the full planar extent of image sensor wafer 400, stress-relieving trenches 410, 420, and 430 may span only a portion of the planar extent of image sensor wafer 400, without departing from the scope hereof. Likewise, image sensor wafer 400 may include more stress-relieving trenches and/or differently arranged stress-relieving trenches than illustrated in FIGS. 4A and 4B, without departing from the scope hereof.

Figure 5:
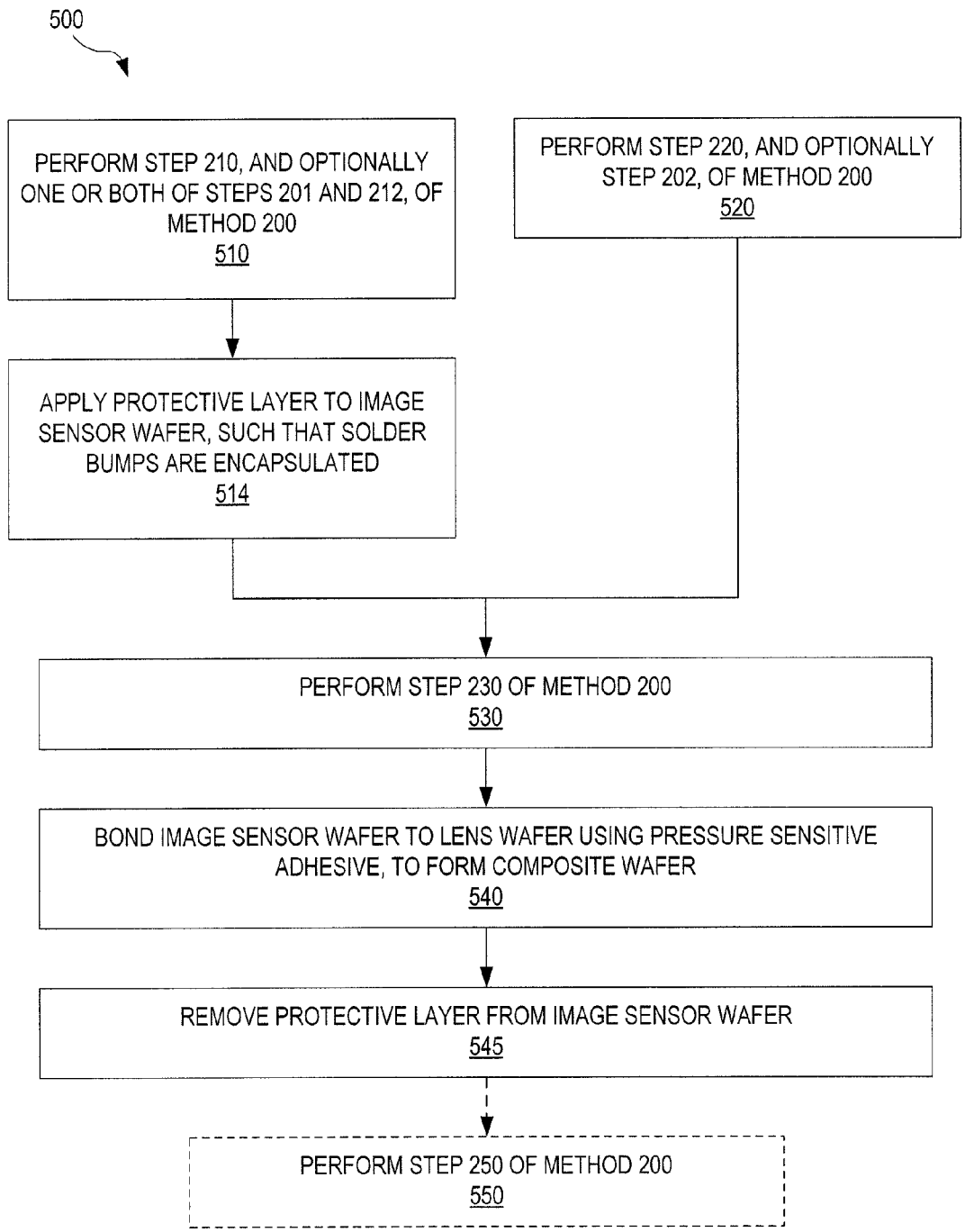
FIG. 5 illustrates a wafer-level bonding method for camera fabrication, which utilizes a pressure sensitive adhesive for bonding an image sensor wafer to a lens wafer, according to an embodiment.

FIG. 5 illustrates one exemplary wafer-level bonding method 500 for camera fabrication, which utilizes a pressure sensitive adhesive for bonding an image sensor wafer, such as image sensor wafer 120 (FIG. 1), to a lens wafer such as lens wafer 110 (FIG. 1). Method 500 is an embodiment of method 200 (FIG. 2). In a step 510, method 500 performs step 210, and optionally one or both of steps 201 and 212, of method 200 (FIG. 2). If included in step 510, step 212 may be performed according to method 300 (FIG. 3). In a step 514, a protective layer is applied to the image sensor wafer, for example image sensor wafer 120 (FIG. 1), such that the protective layer encapsulates at least a portion of the solder bumps of the image sensor wafer. Step 514 is an embodiment of step 214 (FIG. 2). In an embodiment, the protective layer is an ultra-violet-light releasable tape.

Figure 6:
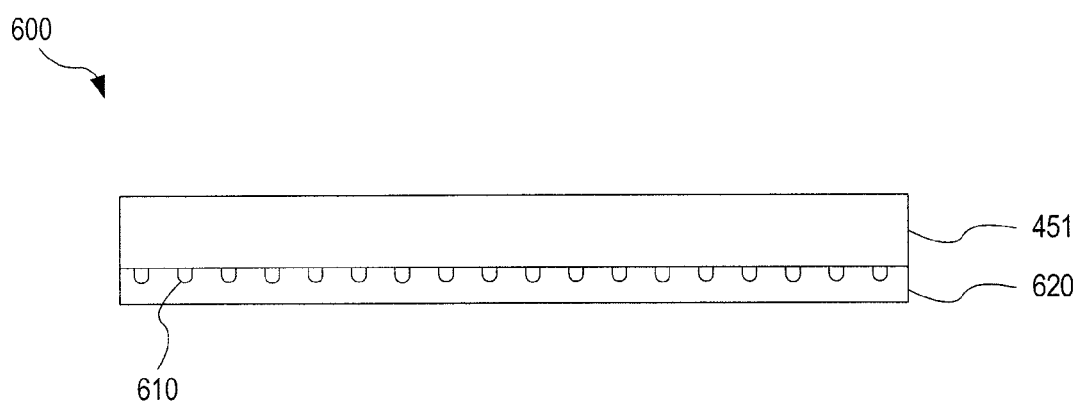
FIG. 6 illustrates an image sensor with a protective layer that encapsulates the solder bumps of the image sensor, according to an embodiment.

FIG. 6 illustrates one exemplary image sensor 600 with a protective layer that encapsulates the solder bumps of image sensor 600. Image sensor 600 illustrates one embodiment of step 514 of method 500 (FIG. 5). Image sensor 600 includes bare image sensor 451 (FIG. 4), which in turn includes solder bumps 610 on the surface opposite the light receiving surface of bare image sensor 451. Image sensor 600 further includes a protective layer 620 that encapsulates solder bumps 610. In one embodiment, protectively layer 620 has thickness and cushion to redistribute local pressure, otherwise applied exclusively to the solder bumps, to other portions of the image sensor wafer. For example, the protective layer may redistribute pressure from the solder bumps to portions of the image sensor wafer located between the solder bumps. In another embodiment, protective layer 620 has indentations that match the location of the solder bumps, such that pressure applied to protective layer 620 in the direction towards bare image sensor 451 is applied only to portions of bare image sensor 451 different from solder bumps 610. While FIG. 6 illustrates only a single bare image sensor 451, protective layer 620 may span larger portions of an image sensor wafer, including portions that do not include an image sensor, without departing from the scope hereof. For clarity of illustration, not all solder bumps 610 are labeled in FIG. 6.

Referring once again to FIG. 5, in a step 520, method 500 performs step 220, and optionally step 202, of method 200 (FIG. 2). In a step 530, method 500 performs step 230 of method 200 (FIG. 2). In a step 540, which is an embodiment of step 240 (FIG. 2), a composite wafer is formed by bonding the image sensor wafer to the lens wafer using a pressure sensitive adhesive. For example, composite wafer 130 (FIG. 1) is formed by bonding images sensor wafer 120 (FIG. 1) to lens wafer 110 (FIG. 1) using a pressure sensitive adhesive. Pressure sensitive adhesive based bonding requires application of mechanical pressure to the image sensor wafer and lens wafer, with the pressure sensitive adhesive disposed therebetween. The mechanical pressure presses together the image sensor wafer, the pressure sensitive adhesive, and the lens wafer. The solder bumps of the image sensor wafer generally protrude from the surface of the image sensor wafer. If mechanical pressure is applied to an unprotected solder bump, there is a risk that the solder bump may break and/or that the local pressure conveyed by the solder bump to other portions of the image sensor wafer in contact with the solder bump may cause a crack in the image sensor wafer. The protective layer applied in step 514 functions to reduce the risk of such breakage. In an embodiment, pressure is applied to only a portion of the image sensor wafer. In this embodiment, step 514 may apply a protective layer to the full surface of the image sensor wafer, facing away from the lens wafer, or only to a portion thereof.

In a step 545, the protective layer applied in step 514 is removed. In one embodiment, associated with the protective layer being an ultra-violet-light releasable tape, the protective layer is removed by exposing the protective layer to ultra-violet light. In another embodiment, the protective layer is removed mechanically or chemically, or removed using a combination of mechanical, chemical, and/or optical methods. Optionally, method 500 further includes a step 550 of performing step 250 of method 200 (FIG. 2). In an alternate embodiment, not illustrated in FIG. 5, step 545 is performed after step 550.

Figure 7:
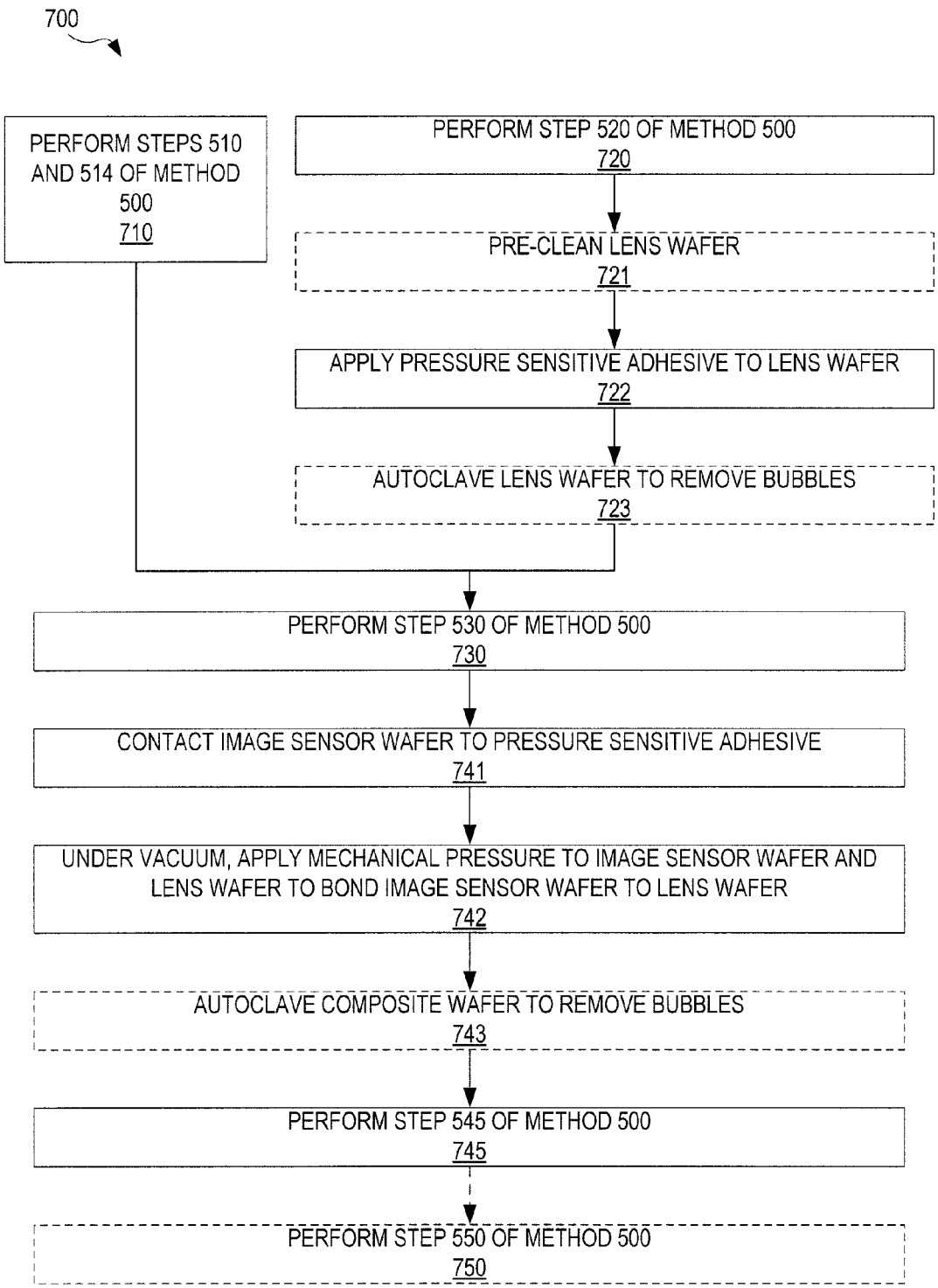
FIG. 7 illustrates an embodiment of the method of FIG. 5, wherein the pressure sensitive adhesive is applied to the lens wafer prior to bonding with the image sensor wafer, and the method includes steps to reduce trapping of air bubbles in and/or at the pressure sensitive adhesive, according to an embodiment.

FIG. 7 illustrates one exemplary wafer-level bonding method 700 for camera fabrication utilizing a pressure sensitive adhesive for bonding an image sensor wafer to a lens wafer. The pressure sensitive adhesive is applied to the lens wafer prior to bonding with the image sensor wafer. Method 700 includes steps to reduce trapping of air bubbles in and/or at the pressure sensitive adhesive, as well as optional steps for removing such bubbles. Method 700 is an embodiment of method 500 (FIG. 5). In a step 710, method 700 performs steps 510 and 514 of method 500 (FIG. 5).

In a step 710, method 700 performs steps 510 and 514 of method 500 (FIG. 5). In a step 720, method 700 performs step 520 of method 500 (FIG. 5). Step 720 is followed by an optional step 721, a step 722, and an optional step 723, performed sequentially. In optional step 721, the lens wafer is pre-cleaned to prepare the lens wafer for application of pressure sensitive adhesive. For example, lens wafer 110 (FIG. 1) is cleaned using a solvent. In step 722, a pressure sensitive adhesive is applied to the lens wafer. For example, a pressure sensitive adhesive is applied to lens wafer 110 (FIG. 1). In optional step 726, the lens wafer is autoclaved, i.e., exposed to elevated temperature and pressure, to remove bubbles trapped at the interface between the pressure sensitive adhesive and the lens wafer, and/or to remove bubbles from the pressure sensitive adhesive. For example, lens wafer 110 (FIG. 1), with a pressure sensitive adhesive adhered thereto, is autoclaved.

In a step 730, method 700 performs step 530 of method 500 (FIG. 5). After performing step 730, method 700 performs steps 741, 742, and, optionally, step 743. Steps 741, 742, and, optionally, step 743, together form an embodiment of step 540 of method 500 (FIG. 5). In step 741, the image sensor wafer is contacted to the pressure sensitive adhesive, which was applied to the lens wafer in step 722. For example, image sensor wafer 120 (FIG. 1) is contacted to a pressure sensitive adhesive applied to lens wafer 110 (FIG. 1). In order to reduce trapping of air bubbles at the interface of the pressure sensitive adhesive and the image sensor wafer, the image sensor wafer is contacted to the pressure sensitive adhesive using a low mechanical pressure. The low mechanical pressure is sufficient for the image sensor wafer to be mechanically coupled with the pressure sensitive adhesive, but insufficient to fully bond the pressure sensitive adhesive with the image sensor wafer. Thus, at least a portion of the air located at the interface between the image sensor wafer and the pressure sensitive adhesive has one or more pathways coupling the air with the surrounding atmosphere. In a step 742, the image sensor wafer and lens wafer, for example image sensor wafer 120 (FIG. 1) and lens wafer 110 (FIG. 1), are bonded together, using the pressure sensitive adhesive. This results in the formation of a composite wafer, such as composite wafer 130 (FIG. 1). Step 742 is performed under vacuum, or at least reduced pressure as compared with standard atmospheric pressure, and includes applying mechanical pressure to the image sensor wafer and the lens wafer to press together the image sensor wafer and the lens wafer. At least a portion of the air located at the interface of the pressure sensitive adhesive with the image sensor wafer, and optionally also at least a portion of any air located at the interface of the pressure sensitive adhesive with the lens wafer, is pumped away while the image sensor wafer is pressed against the lens wafer. Accordingly, the amount of air trapped at the interface between the pressure sensitive adhesive and the image sensor wafer, and optionally the lens wafer, is reduced.

In optional step 743, the composite wafer is autoclaved to remove at least a portion of residual air bubbles from the pressure sensitive adhesive and interfaces between the pressure sensitive adhesive and the image sensor wafer and the lens wafer. For example, composite wafer 130 (FIG. 3) is autoclaved to remove residual air bubbles from the pressure sensitive adhesive applied in step 722, the interface between this pressure sensitive adhesive and image sensor wafer 120 (FIG. 1), and the interface between this pressure sensitive adhesive and lens wafer 110 (FIG. 1).

In a step 745, method 700 performs step 545 of method 500 (FIG. 5). Optionally, method 700 further includes a step 750 of performing step 550 of method 500 (FIG. 5).

FIG. 8 illustrates one exemplary method 800 for optically aligning an image sensor wafer, such as image sensor wafer 120 (FIG. 1), with a lens wafer, such as lens wafer 110 (FIG. 1). Method 800 is an embodiment of step 230 of method 200 (FIG. 2). In a step 810, an image sensor wafer is aligned with a lens wafer using optical access through the lens wafer to the image sensor wafer. For example, image sensor wafer 120 (FIG. 1) is aligned with lens wafer 110 (FIG. 1) using optical access through lens wafer 110 to image sensor wafer 120. In an embodiment, step 810 includes a step 820, wherein at least two reference marks on the lens wafer are aligned with at least two respective image sensors of the image sensor wafer. The alignment may be evaluated visually, aided by optical viewing instruments, or automatically by optical instruments.

Figure 9A:
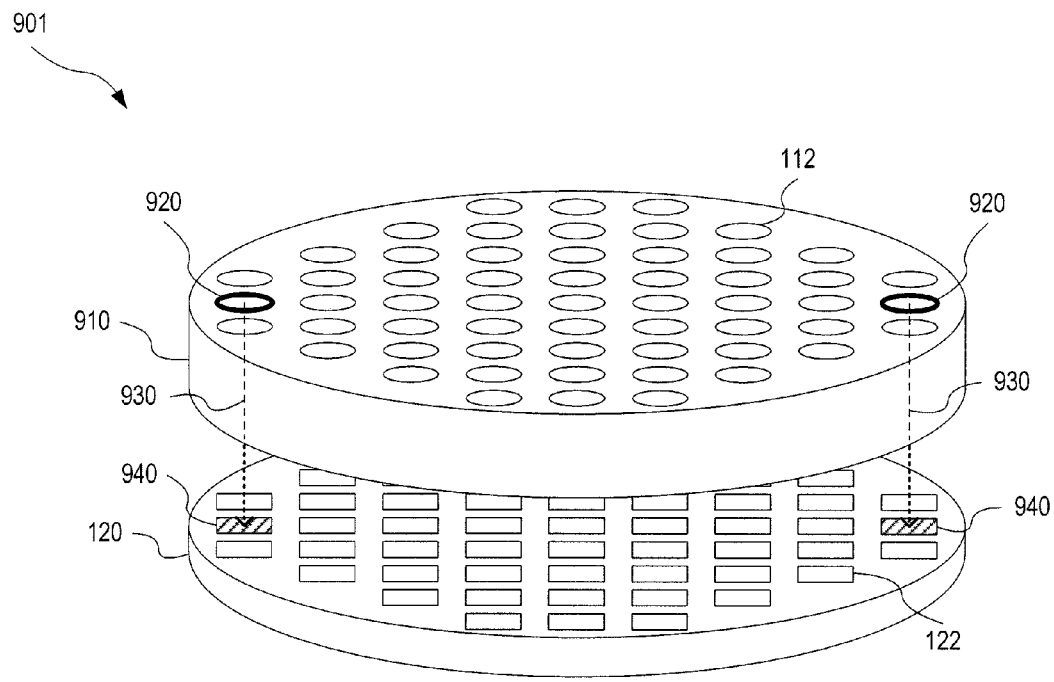
FIGS. 9A and 9B are diagrams that illustrate the method of FIG. 8, according to an embodiment.
Figure 9B:
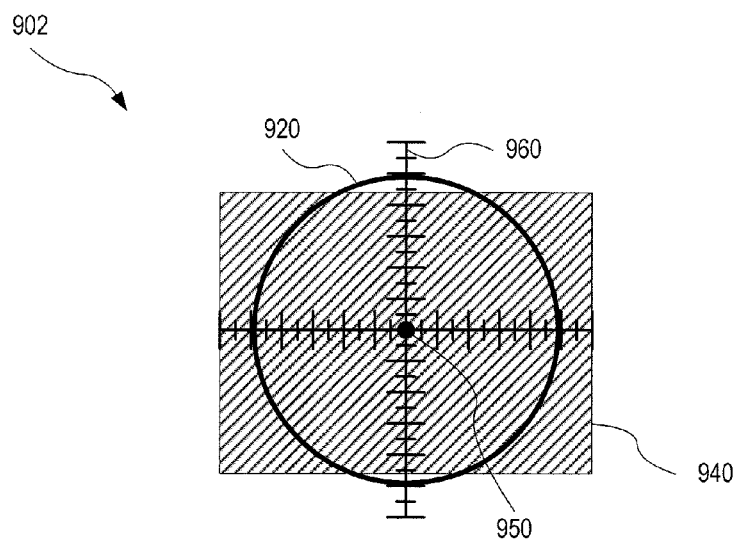

FIGS. 9A and 9B illustrate, by example, step 820 for one exemplary pair of image sensor wafer and lens wafer. FIGS. 9A and 9B are best viewed together. FIG. 9A is a diagram 901 that shows, in perspective view, alignment of image sensor wafer 120 (FIG. 1) with respect to a lens wafer 910. Lens wafer 910 is an embodiment of lens wafer 110 (FIG. 1), which includes two reference marks 920 in addition to a plurality of lenses 112 (FIG. 1). Reference marks 920 are located in portions of lens wafer 910 that coincide with respective optical access paths 930 through lens wafer 910 to image sensor wafer 120. In one embodiment, reference marks 920 are lenses 112. In another embodiment, references marks 920 are optically clear portions of lens wafer 910, each including a feature, such as an aperture, for evaluating the position of reference mark 920. While FIG. 9B illustrates reference marks 920 as being circulary, reference mark 920 may have other shape, such as square, rectangular, circular, or a cross, without departing from the scope hereof. In yet another embodiment, all of lens wafer 910 is optically clear, and reference marks 920 are features, for instance located on the surface of lens wafer 910, for evaluating the positions of reference marks 920. Two of image sensors 122 of image sensor wafer 120 function as reference marks 940. In an embodiment, each reference mark 940 is the outline of the photosensitive surface of an image sensor 122. In an embodiment, each reference mark 940 is the color filter of an image sensor 122, where the color filter may an IR filter and/or a color filter array for providing color imaging functionality, such as a Bayer-type color filter array. Step 820 of method 800 (FIG. 8) aligns references marks 920 with corresponding reference marks 940 using optical access paths 930. For clarity of illustration, not all lenses 112 and image sensors 122 are labeled in FIG. 9A. While FIG. 9A shows reference marks 940 as coinciding with outermost located image sensors 122, reference marks 940 may coincide with image sensors 122 located in interior portions of the array of image sensors 122 of image sensor wafer 120, without departing from the scope hereof.

FIG. 9B is a diagram 902 showing a top-plan view of one reference mark 920 aligned with one reference mark 940. FIG. 9B thus illustrates the view along one optical access path 930. Using optical access path 930, the position of reference mark 920, projected onto the plane of image sensor wafer 120, and reference mark 940 are centered at a common location 950. The optical evaluation of the positioning of reference mark 920 relative to reference mark 940 may be aided by optical guides, provided by an optical viewing instrument, such as cross hairs 960.

Returning to FIG. 8, an embodiment of step 810 includes a step 830, wherein alignment is performed further utilizing optical access through an optically clear adhesive that is disposed between the image sensor wafer and the lens wafer. Step 830 is useful for implementation of method 800 into wafer-level bonding methods that apply an adhesive to one or both of the image sensor wafer and the lens wafer prior to alignment thereof, such as method 700 (FIG. 7). Step 830 assumes that the adhesive is optically clear, such that method 800 may be performed with the adhesive in place between the image sensor wafer and the lens wafer. Optically clear adhesives include certain types of pressure sensitive adhesives, dry films, and epoxy resins. Embodiments of method 800 that include step 830 may be advantageously implemented in methods 500 (FIG. 5) and 700 (FIG. 7) as steps 530 and 730, respectively.

Figure 10:
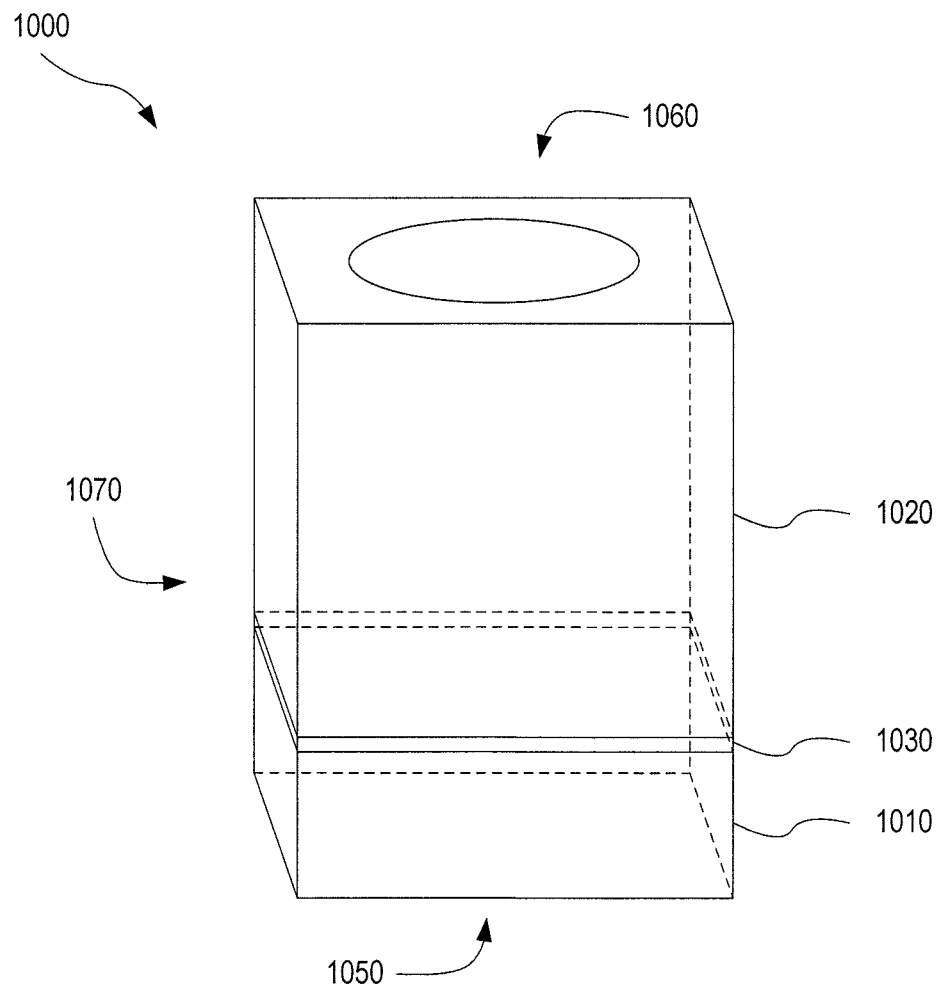
FIG. 10 illustrates a camera fabricated according to an embodiment of the method of FIG. 2, according to an embodiment.

FIG. 10 illustrates one exemplary camera 1000 fabricated according to method 200 (FIG. 2), with step 250 (FIG. 2) included. Camera 1000 is an embodiment of camera 140 (FIG. 1). Camera 1000 includes an image sensor portion 1010 of rectangular cuboidal shape, and a lens portion 1020 of rectangular cuboidal shape. In an embodiment, camera 1000 further includes an adhesive layer 1030, of rectangular cuboidal shape, disposed between image sensor portion 1010 and lens portion 1040. Image sensor portion 1010 is a portion of image sensor wafer 120 (FIG. 1), including an image sensor 122 (FIG. 1). Lens portion 1020 is a portion of lens wafer 110 (FIG. 1), including a lens 112 (FIG. 1). In certain embodiments, adhesive layer 1030 is a pressure sensitive adhesive.

Camera 1010 has a bottom surface 1050, a top surface 1060, and four side surfaces 1070. For clarity of illustration, only one of the four side surfaces 1070 is labeled in FIG. 10. Each side surface 1070 includes a surface of lens portion 1020, a surface of image sensor portion 1010, and, optionally, a surface of adhesive layer 1030. Camera 1010 is the product of step 250 of method 200 (FIG. 2). Accordingly, for each side surface 1070, all portions of side surface 1070 are formed in the same dicing operation. Therefore, side surface 1070 is planar with no step associated with interfaces between image sensor portion 1010, lens portion 1020, and optional adhesive portion 1030.

Methods disclosed herein may be practiced in conjunction with methods disclosed in U.S. Patent Application Ser. No. 14/270,281 Entitled "System And Method For Black Coating Of Camera Cubes At Wafer Level.

Combinations of Features

Features described above as well as those claimed below may be combined in various ways without departing from the scope hereof. For example, it will be appreciated that aspects of one wafer-level bonding method for camera fabrication, or associated camera, described herein may incorporate or swap features of another wafer-level bonding method for camera fabrication, or associated camera, described herein. The following examples illustrate possible, non-limiting combinations of embodiments described above. It should be clear that many other changes and modifications may be made to the methods and device herein without departing from the spirit and scope of this invention:

(A) A wafer-level method for fabricating a plurality of cameras may include modifying an image sensor wafer to reduce risk of the image sensor wafer warping.

(B) The wafer-level method denoted as (A) may further include bonding the image sensor wafer to a lens wafer to form a composite wafer that includes the plurality of cameras.

(C) In the wafer-level method denoted as (B), the step of bonding may include bonding the image sensor wafer to the lens wafer using a pressure sensitive adhesive.

(D) The wafer-level methods denoted as (B) and (C) may further include applying a protective layer to the image sensor wafer for reducing risk of the image sensor wafer breaking during the step of bonding (E) In the wafer-level method denoted as (D), the protective layer may encapsulate solder bumps of the image sensor wafer.

(F) In the wafer-level methods denoted as (D) and (E), the protective layer may be an ultraviolet-light-releaseable tape.

(G) The wafer-level method denoted as (F) may further include, after the step of bonding, removing the protective layer using ultraviolet light.

(H) The wafer-level methods denoted as (B) through (G) may further include aligning the image sensor wafer with the lens wafer using an optical method.

(I) In the wafer-level method denoted as (H), the step of aligning may include aligning, by optical access through the lens wafer, at least two alignment marks of the lens wafer with two image sensors of the image sensor wafer.

(J) The wafer-level methods denoted as (H) and (I) may further include applying an optically clear adhesive to the lens wafer.

(K) In the wafer-level method denoted as (J), the step of bonding may include bonding the image sensor wafer to the lens wafer using the optically clear adhesive, wherein the step of aligning is performed after the step of applying the optically clear adhesive and before the step of bonding.

(L) In the wafer-level methods denoted as (J) and (K), the optically clear adhesive may be a pressure sensitive adhesive.

(M) In the wafer-level methods denoted as (A) through (L), the step of modifying the image sensor wafer to reduce risk of warping may include relieving stress from the image sensor wafer.

(N) In the wafer-level method denoted as (M), the step of relieving stress may include applying thereto at least one cut to form a trench in the image sensor wafer.

(O) In the wafer-level methods denoted as (M) and (N), the image sensor wafer may include a sensor layer and a cover glass layer disposed on the sensor layer, and the step of relieving stress may include applying at least one cut to a portion of the image sensor wafer not overlapping with an image sensor, wherein the at least one cut penetrates the sensor layer and forms a trench in the cover glass.

(P) In the wafer-level method denoted as (O), the step of applying at least one cut may include applying at least one cut that spans the image sensor wafer along a first direction in the plane of the image sensor wafer.

(Q) In the wafer-level method denoted as (P), the step of applying at least one cut may further include applying at least one cut that spans the image sensor wafer along a second direction in the plane of the image sensor wafer, wherein the second direction is different from the first direction.

(R) A wafer-level method for fabricating a plurality of cameras may include bonding an image sensor wafer to a lens wafer, using a pressure sensitive adhesive, to form a composite wafer that includes the plurality of cameras.

(S) The wafer-level method denoted as (R) may further include modifying the image sensor wafer to reduce risk of the image sensor breaking during the step of bonding.

(T) In the wafer-level method denoted as (S), the step of modifying may include applying a protective layer to the image sensor wafer.

(U) In the wafer-level method denoted as (T), the protective layer may encapsulate solder bumps of the image sensor wafer.

(V) In the wafer-level methods denoted as (T) and (U), the protective layer may be an ultraviolet-light-releaseable tape.

(W) The wafer-level method denoted as (V) may further include, after the step of bonding, removing the protective layer using ultraviolet light.

(X) The wafer-level methods denoted as (R) through (W) may further include applying the pressure sensitive adhesive to the lens wafer, wherein the pressure sensitive adhesive is optically clear.

(Y) The wafer-level method denoted as (X) may further include aligning the image sensor wafer with the lens wafer, using optical access through the lens wafer and the pressure sensitive adhesive.

(Z) In the wafer-level method denoted as (Y), the step of aligning may include aligning, using the optical access through the lens wafer and the pressure sensitive adhesive, at least two alignment marks of the lens wafer with two of the plurality of image sensors.

(AA) In the wafer-level methods denoted as (R) through (Z), the step of bonding may include contacting the image sensor to the pressure sensitive adhesive, and applying mechanical pressure, under vacuum, to the image sensor wafer and lens wafer to form the composite wafer.

(AB) In the wafer-level methods denoted as (R) through (AA), the step of bonding may further include autoclaving the composite wafer to remove bubbles from at least one of the pressure sensitive adhesive, interface between the pressure sensitive adhesive and the image sensor wafer, and interface between the pressure sensitive adhesive and the lens wafer.

(AC) In the wafer-level methods denoted as (R) through (AB), the step of bonding may include cleaning surface portions of the lens wafer, to which the pressure sensitive adhesive is applied in the step of applying the pressure sensitive adhesive.

(AD) In the wafer-level methods denoted as (R) through (AC), the step of bonding may include rolling the pressure sensitive adhesive onto to the lens wafer.

(AE) In the wafer-level methods denoted as (R) through (AC), the step of bonding may include autoclaving the lens wafer with the pressure sensitive adhesive to remove bubbles from at least one of the pressure sensitive adhesive and interface between the pressure sensitive adhesive and the lens wafer.

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and device, which, as a matter of language, might be said to fall therebetween.

What is claimed is:

1. A wafer-level method for fabricating a plurality of cameras, comprising:
   making at least one stress-relieving cut in an image sensor wafer having a sensor layer, with a plurality of image sensors, and a cover glass layer disposed on the sensor layer, so as to reduce risk of the image sensor wafer warping, each of the at least one stress-relieving cut penetrating the sensor layer and forming a trench in the cover glass layer; and
   bonding, using a pressure sensitive adhesive, the image sensor wafer to a lens wafer to form a composite wafer that includes the plurality of cameras.

2. The wafer-level method of claim 1, the at least one cut being in a portion of the image sensor wafer not overlapping with any of the image sensors.

3. The wafer-level method of claim 1, the step of making at least one cut comprising applying at least one first cut that spans the image sensor wafer along a first direction in the plane of the image sensor wafer.

4. The wafer-level method of claim 3, the step of applying at least one cut further comprising applying at least one second cut that spans the image sensor wafer along a second direction in the plane of the image sensor wafer, the second direction being different from the first direction.

5. The wafer-level method of claim 1, further comprising applying a protective layer to the image sensor wafer for reducing risk of the image sensor wafer breaking during the step of bonding, the protective layer encapsulating solder bumps of the image sensor wafer.

6. The wafer-level method of claim 5, the protective layer being an ultraviolet-light-releaseable tape, the wafer-level method further comprising, after the step of bonding, removing the protective layer using ultraviolet light.

7. The wafer-level method of claim 1, further comprising aligning the image sensor wafer with the lens wafer using an optical method.

8. The wafer-level method of claim 7, the step of aligning comprising aligning, by optical access through the lens wafer, at least two alignment marks of the lens wafer with two image sensors of the image sensor wafer.

9. The wafer-level method of claim 8, further comprising applying an optically clear adhesive to the lens wafer, the step of bonding comprising bonding the image sensor wafer to the lens wafer using the optically clear adhesive, the step of aligning being performed after the step of applying the optically clear adhesive and before the step of bonding.

10. The wafer-level method of claim 9, the optically clear adhesive being a pressure sensitive adhesive.

11. The wafer-level method of claim 1, in the step of making, the cover glass layer being disposed on the sensor layer in direct contact with the sensor layer.

12. A wafer-level method for fabricating a plurality of cameras, comprising:
    applying a protective layer to an image sensor wafer to reduce risk of the image sensor breaking during a subsequent step of bonding the image sensor wafer to a lens wafer, the protective layer encapsulating solder bumps of the image sensor wafer;
    bonding the image sensor wafer to the lens wafer by contacting the image sensor wafer and the lens wafer to opposite sides of a pressure sensitive adhesive, to form a composite wafer that includes the plurality of cameras.

13. The wafer-level method of claim 12, the protective layer being an ultraviolet-light-releaseable tape, the wafer-level method further comprising, after the step of bonding, removing the protective layer using ultraviolet light.

14. The wafer-level method of claim 12, further comprising:
    applying the pressure sensitive adhesive to the lens wafer, the pressure sensitive adhesive being optically clear; and
    aligning the image sensor wafer with the lens wafer, using optical access through the lens wafer and the pressure sensitive adhesive.

15. The wafer-level method of claim 14, the step of bonding comprising:
    contacting the image sensor to the pressure sensitive adhesive; and
    applying mechanical pressure, under vacuum, to the image sensor wafer and lens wafer to form the composite wafer.

16. The wafer-level method of claim 15, the step of bonding further comprising autoclaving the composite wafer to remove bubbles from at least one of the pressure sensitive adhesive, interface between the pressure sensitive adhesive and the image sensor wafer, and interface between the pressure sensitive adhesive and the lens wafer.

17. The wafer-level method of claim 14, the step of aligning comprising aligning, using the optical access through the lens wafer and the pressure sensitive adhesive, at least two alignment marks of the lens wafer with two of the plurality of image sensors.

18. The wafer-level method of claim 14, the step of bonding comprising:
cleaning surface portions of the lens wafer, to which the pressure sensitive adhesive is applied in the step of applying the pressure sensitive adhesive;
rolling the pressure sensitive adhesive onto to the lens wafer; and
autoclaving the lens wafer with the pressure sensitive adhesive to remove bubbles from at least one of the pressure sensitive adhesive and interface between the pressure sensitive adhesive and the lens wafer.

19. The wafer-level method of claim 12, the step of bonding comprising:
applying the pressure sensitive adhesive to the lens wafer;
aligning the lens wafer with the image sensor wafer;
contacting the image sensor to the pressure sensitive adhesive; and
applying mechanical pressure to the image sensor wafer and the lens wafer to form the composite wafer.

\* \* \* \* \*